(12) United States Patent
Kizziar

(10) Patent No.: US 7,583,154 B1
(45) Date of Patent: Sep. 1, 2009

(54) VOLTAGE CONTROLLED OSCILLATOR

(75) Inventor: John Kizziar, Spokane, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 336 days.

(21) Appl. No.: 11/241,078

(22) Filed: Sep. 30, 2005

(51) Int. Cl.
*H03L 1/00* (2006.01)

(52) U.S. Cl. .............................. 331/65; 331/44; 331/66; 331/176

(58) Field of Classification Search ................... 331/44, 331/65, 66, 176
See application file for complete search history.

(56) References Cited

U.S. PATENT DOCUMENTS

| | | | |
|---|---|---|---|
| 3,971,998 | A | 7/1976 | Gopinath et al. |
| 4,728,906 | A | 3/1988 | Turl et al. |
| 5,179,725 | A | 1/1993 | Camp, Jr. et al. |
| 5,696,468 | A * | 12/1997 | Nise .............................. 331/14 |
| 5,739,729 | A | 4/1998 | Tchamov et al. |
| 6,046,646 | A * | 4/2000 | Lo et al. ........................ 331/10 |
| 6,466,096 | B1 * | 10/2002 | DeVito .......................... 331/11 |
| 6,853,262 | B2 | 2/2005 | Feilkas et al. |
| 6,861,913 | B1 | 3/2005 | Herzel et al. |
| 6,876,266 | B2 | 4/2005 | Koo et al. |
| 7,023,286 | B2 * | 4/2006 | Norman et al. ................ 331/65 |
| 7,098,748 | B2 * | 8/2006 | Schmidt ....................... 331/176 |
| 7,098,750 | B2 * | 8/2006 | Morkovich ............. 331/177 V |
| 7,268,633 | B2 * | 9/2007 | von Kaenel ................... 331/17 |

* cited by examiner

*Primary Examiner*—Robert Pascal
*Assistant Examiner*—James E Goodley

(57) ABSTRACT

A voltage-controlled oscillator is provided that avoids use of any crystal resonator, or any resonator that is external to and not integrated upon the voltage-controlled oscillator monolithic substrate. The present oscillator can receive two or more parameters that would likely have an affect on the oscillator frequency, yet the oscillator includes compensating transfer functions that will remove, or correct for, that effect. Transfer functions involve electronic subsystems implemented in hardware or software that receive the input parameter that has changed from a nominal value, and will note the drift in output frequency, yet will compensate for that drift so that the output frequency remains near the nominal value. The voltage-controlled oscillator preferably is an LCVCO, and the transfer function outputs can be summed to take into account multiple parameter changes. In addition, the output frequency can be placed into a wider band spread spectrum output using a modulating, spread spectrum circuitry if desired.

19 Claims, 3 Drawing Sheets

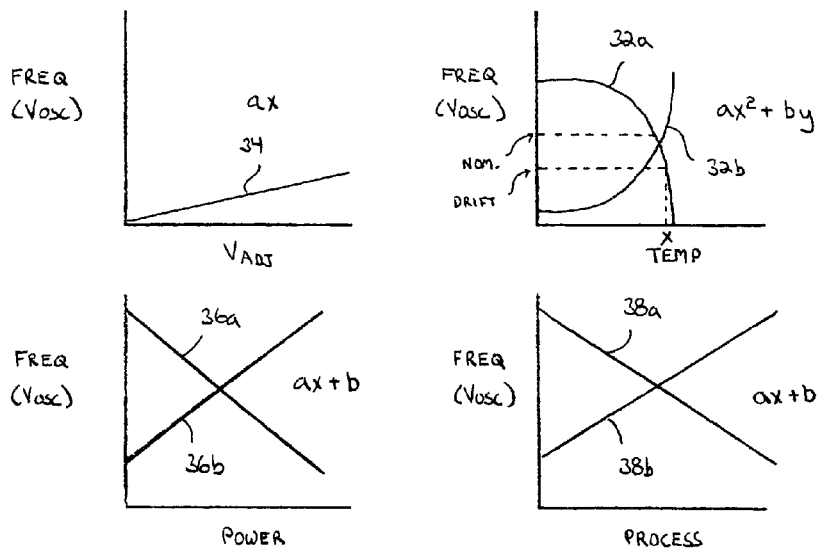
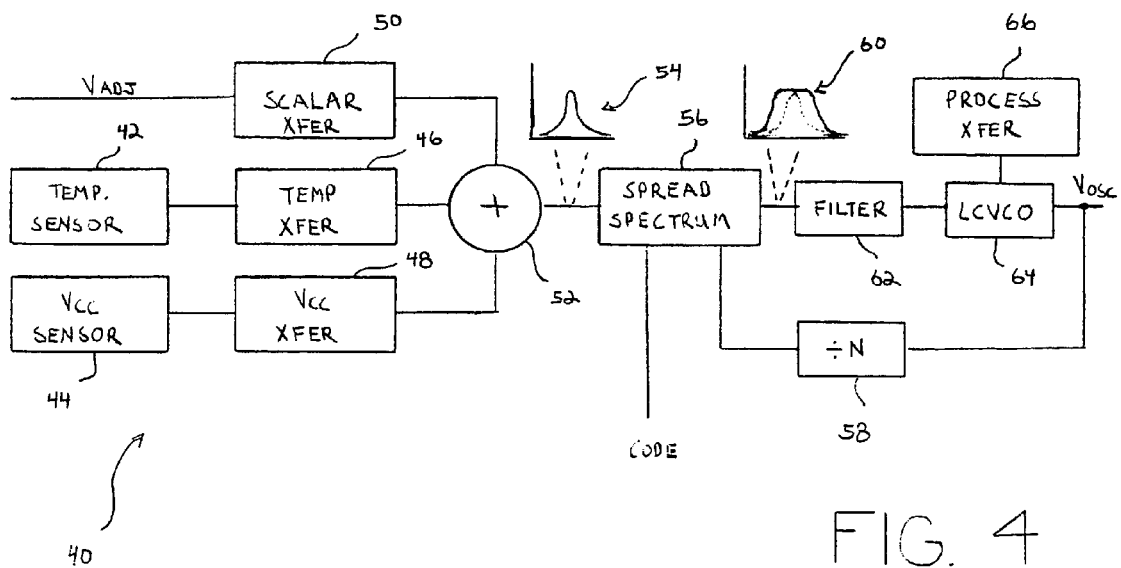
FIG. 3
FIG. 4

VOLTAGE CONTROLLED OSCILLATOR

BACKGROUND OF THE INVENTION

1. Field of the Invention

The present invention relates to a voltage controlled oscillator. More particularly, the invention relates to an open-loop (i.e., "unlocked") oscillator and frequency generation method that can utilize changes in output frequency of the oscillator as a function of changes which affect the oscillator performance to determine transfer functions and apply those transfer functions to correct any skewing of the oscillator output.

2. Description of the Related Art

The following descriptions and examples are not admitted to be prior art or conventional by virtue of their inclusion within this section.

Within nearly every electronic subsystem is some sort of generator that produces cyclical waveforms. The waveform generator is oftentimes referred to as an oscillator that produces regular oscillation signals. Depending on the application, an oscillator can be used simply as a source of regularly spaced pulses or as clock signals. Oscillators are oftentimes rated depending on their stability and accuracy, frequency adjustability (i.e., tunability), and power consumption.

There are numerous types of oscillators in the marketplace. A simple kind of oscillator is an RC relaxation oscillator. More complex and stable oscillators involve the more popular LC oscillator. While LC oscillators are more stable than RC oscillators, a crystal oscillator is generally more stable and accurate than LC oscillators.

Crystal oscillators use a piece of quartz (i.e., glass or silicon dioxide) that is cut and polished to vibrate at a specified frequency. Quartz is piezoelectric, wherein acoustic waves in the crystal are driven by an applied electric field and, in turn, can generate a voltage at the surface of the crystal. Because of the way the quartz is cut, crystal oscillators are formed as a bulk material separate and apart from the circuit in which the oscillator is coupled. Thus, crystal or ceramic oscillators (i.e., resonators) are not generally integrated into silicon and are therefore more expensive than the less accurate, less stable, LC oscillators.

It would be desirable to implement an LC oscillator because of its integration capability and lower manufacturing expense. However, most conventional LC oscillators suffer to a greater or lesser extent from drift introduced by environmental changes (hereinafter known as external events or "parameters") such as temperature, power supply, and ground supply fluctuations, and variation in electrical components associated with the oscillating source. LC oscillators are also affected by internal parameters, such as the design characteristics of semiconductor layout and the overall fluctuations or changes from run-to-run in the fabrication or processing of the oscillator components.

One mechanism in which to minimize internal and external parameter fluctuations that cause the oscillating signal to drift is to implement the LC oscillator into a "locked" system. In a locked system, the voltage-controlled oscillator (VCO) of the LCVCO oscillator is placed within a closed loop. A signal driven from the VCO is fed back to and compared with a reference signal. One form of comparison is through a phase or frequency detector. The voltage proportional to the phase error is then applied to the VCO as part of the overall phase-locked loop (PLL).

While the closed loop PLL-based LCVCO system is relatively stable and accurate, the closed loop system is also complex and requires a reference signal most often derived from an oscillator utilizing quartz or other non-integrated resonator. In the case of a locked or unlocked system, an input voltage is applied to the VCO and, specifically, to the capacitor of the LCVCO. As stated above, the oscillating signal output is generally affected in either a linear or non-linear fashion based on external and internal parameters. However, the resulting drift must be accounted for in an unlocked system whereas a locked system eliminates the drift.

Therefore, it would be desirable to implement an oscillator that is fully integrated on a single monolithic substrate, and does not rely upon an external crystal resonator or the large and expensive conventional SAW resonators or MEMs devices. The desired system is preferably one that is a fully integrated, voltage-controlled oscillator (VCO) and, more preferably, an LCVCO.

SUMMARY OF THE INVENTION

The problems outlined above are in large part solved by a VCO that has a LC resonant circuit, and which avoids a crystal, ceramic, SAW, or MEMs resonant circuit. The present VCO having a LC resonant circuit is hereby known as an LCVCO, and the LCVCO is implemented in an open loop environment.

The drift in the oscillating frequency output from the LCVCO can be reduced by applying compensation. Compensation involves computing a first transfer function by measuring the resulting oscillating signal frequency caused by changes to the internal and external parameters that are sensed or read from the VCO. When the appropriate parameter is measured, the transfer function will determine what would be the resulting oscillating signal frequency. The transfer function can be either a linear or non-linear curve and is stored as a table of parameter values with corresponding oscillating signal output frequencies.

A second transfer function can be calculated by measuring the resulting oscillating signal frequency caused by changes to the voltage control input to the VCO. This transfer function can be either a linear or non-linear curve and is stored as a table of voltage control input values with corresponding oscillating signal output frequencies.

A third transfer function can be calculated from the first and second transfer functions. This transfer function relates internal or external parameters that are sensed or read from the VCO to a voltage control input value causing an equal but opposite change in the oscillating signal frequency. This transfer function can be either a linear or non-linear curve and can be stored either as a table of parameter values with corresponding voltage control input values, or as coefficients of a fitted curve which approximates the values of the table.

The table of the third transfer function forms the appropriate curve which, when compared to an incoming parameter value resulting possibly from operating the VCO under specific conditions or events, when combined with the actual transfer behavior of the VCO can derive an oscillating signal frequency. However, that frequency might drift from its nominal value and thus the transfer function will increase or decrease a resulting voltage output from the transfer function circuit. The increase or decrease in voltage will then be fed as a voltage value to the VCO, thereby causing the oscillating signal output frequency from the VCO to be placed back at its nominal frequency.

Thus, the table will form the transfer function curve, and the transfer function circuitry will read what would be the drifted frequency and apply a compensating voltage so that the new, compensated voltage, when applied to the VCO, will produce a non-drifted oscillating signal frequency. Thus, the transfer function not only stores performance characteristics based on parameter changes, but also applies compensation voltages to produce a new, compensated input voltage that is then applied to the variable capacitor of the LCVCO. Moreover, the LCVCO operates entirely in an open loop environment with the tunability of the oscillating signal output being wide and stable based on the transfer function compensation capability at the input to the LCVCO.

Broadly speaking, the present invention contemplates a voltage-controlled oscillator (VCO). The VCO comprises at least two sensors for determining two corresponding parameters that independently affect an output frequency of the oscillator. A transfer function can be coupled to receive each of the parameters and produce a corresponding voltage that compensates for any changes in the parameters and the resulting skewing of the output frequency. A summing node can be coupled to the transfer function for adding each corresponding voltage and forwarding the sum result to an input of the oscillator. The input might be that which controls, for example, the capacitance value of a variable capacitor that is coupled either in series with or parallel to an inductor.

The sensors might comprise a temperature sensor, a power supply sensor, and/or a test circuit having semiconductor fabrication sensitive layout. The parameters can comprise external or internal events that would normally cause skewing of the oscillating frequency output from the oscillator, but for the input voltage being compensated in accordance herewith. The transfer function might comprise an execution engine adapted to fetch a table of values and produce a voltage that compensates for skewing of the oscillating signal output frequency. A scalar circuit may be configured to intercept a user-defined input voltage and adjust the capacitance of the variable capacitor to scale the input voltage by a predetermined percentage before forwarding the scaled input voltage to the variable capacitor via the summing node.

According to an alternative embodiment, a spread spectrum circuit might be used and coupled to receive a voltage output from the summing node that is oscillating at a carrier frequency, and to modulate the carrier frequency to produce a spread spectrum output band based on a code forwarded to the spread spectrum circuit.

According to another embodiment, an electronic system is provided for producing an oscillating signal that oscillates at a particular frequency. The system includes a first circuit having an input for converting a parameter that affects the frequency of the oscillating signal to a voltage that is at a nominal value, and which would not cause skewing of the oscillating signal frequency even though the parameter value has changed. A summing node is then used for adding the voltage to a scaled, user-defined, input voltage. A second circuit can be adapted to produce the oscillating signal controlled by the summing node output.

According to yet another embodiment, a method is provided for producing an oscillating signal. The method includes converting a parameter that affects the frequency of the oscillating signal to a voltage that is corrected such that the oscillating signal output frequency does not change even though a value of the parameter has changed. The voltage is then added to a scaled, user-defined, input voltage. The oscillating signal is then produced having a frequency that is controlled by the added voltages.

BRIEF DESCRIPTION OF THE DRAWINGS

Other objects and advantages of the invention will become apparent upon reading the following detailed description and upon reference to the accompanying drawings in which:

FIG. 3 are graphs of exemplary transfer functions represented as a sequence of parameters at corresponding output frequencies;

FIG. 4 is a block diagram of the transfer functions applied to parameter inputs, the result of which is summed to correct for skewing of the oscillator output frequency;

Figure 1:
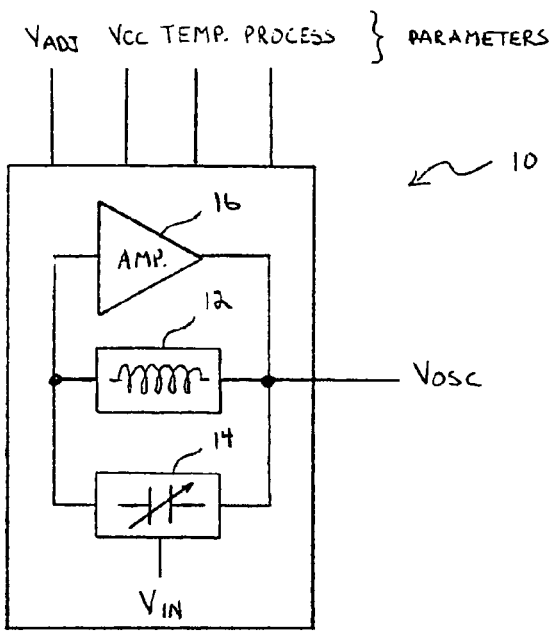
FIG. 1 is a block diagram of a voltage-controlled oscillator according to one embodiment.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now the drawings, FIG. 1 illustrates one form of a voltage-controlled oscillator (VCO) 10. While it is recognized that there are numerous types or forms of a VCO, FIG. 1 illustrates only one exemplary form. All such forms and designs of any oscillator which can have a variable output frequency, based on an input voltage, fall within the spirit of the present VCO. VCO 10 may include an LC resonator circuit formed by, for example, a fixed inductor 12 and a variable capacitor 14. Inductor 12 can be connected either in parallel or in series with capacitor 14, or can be coupled directly or indirectly to one another provided, of course, the LC tank provides a resonating frequency.

Capacitor 14 can be formed as a single capacitor or as an array of capacitors selectively coupled together. As a variable capacitor, the capacitance value can be adjusted based on an input voltage $V_{IN}$ applied to an input, or by selectively coupling or decoupling members of an array of capacitors. One form of variable capacitor is a varactor. Thus, the resonating circuit of inductor 12 and capacitor 14 can be tuned by adjusting the capacitance value of the varactor. To maintain the resonating frequency, an amplifier 16 can be placed between the oscillating terminals of the resonating circuit or tank. The resonating tank circuit and the amplifier thereby form a voltage-controlled oscillator. Output from the voltage-controlled oscillator can be either single-ended or dual-ended depending on whether only one terminal is connected to the output port. As shown, the voltage-controlled oscillator 10 is single-ended with the output being the oscillating signal $V_{OSC}$ as shown.

There are numerous internal and external parameters which affect the frequency of the oscillating signal even though the input voltage might not change. A listing of some, but certainly not all such parameters, include the input voltage being adjusted external to oscillator 10 via a user $V_{ADJ}$, the power supply voltage $V_{CC}$, the temperature at which oscillator 10 is subjected, and the parameters used in either laying out the oscillator components and spacing therebetween, as well as the fabrication sequence and recipe used in forming oscillator 10 upon a semiconductor substrate. Those parameters can change over time and from fabrication run-to-run. That change will cause a skewing of the oscillating signal output frequency of $V_{OSC}$ even though the input voltage $V_{IN}$ does not change. To compensate for the output skewing, the characteristics of the oscillator must be known beforehand.

Figure 2:
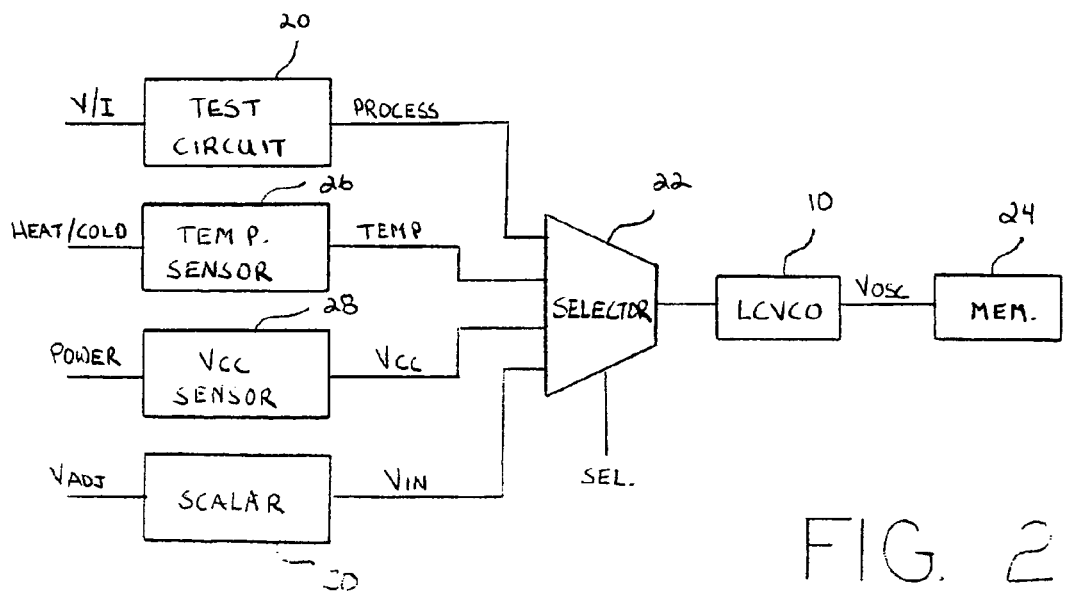
FIG. 2 is a block diagram of a circuit that can measure oscillator output as a function of external and internal parameters that affect the oscillator output, and store a table of output frequency corresponding to those parameters within a memory device.

FIG. 2 illustrates one example by which the operating characteristics can be determined, possibly in the field during operation of the oscillator. Another mechanism is to simulate the oscillator through computerized modeling or the like, and store the characterizations (or skewing) at different parameter values. It may be beneficial to actually test the oscillator in the field, similar to a built-in-self-test (BIST). FIG. 2 indicates one example of using a BIST mechanism to characterize the oscillator performance characteristics when the parameters change.

For example, to derive the effects of processing changes on the output frequency $V_{OSC}$, a test circuit 20 can be designed to receive various voltage and current values. The resulting voltages and currents can then be measured to determine whether the actual lithography and processing performed on silicon differs from an idealized design and process. If so, the amount of change can be recorded by selecting the PROCESS input to selector 22 and passing that input to LCVCO 10. The resulting output frequency for a particular process change and, specifically, the drift amount for each process change can be recorded in memory 24. The table of process change to output frequency skewing is maintained in memory 24 for later recall when deriving a transfer function.

As with process skew, temperature changes can also be sensed by sensor 26, selected by selector 22 and placed as a voltage value onto LCVCO 10, along with the input voltage to form an output frequency, the corresponding table of which is stored in memory 24. As with process and temperature values, the power supply changes can be sensed by sensor 28 and fed to selector 22. Along with the input voltage, the sensed change in the power supply voltage is placed upon LCVCO 10, and the resulting power supply change and output frequency drift is stored in memory 24. In all cases in which parameters are read or sensed, the input voltage along with the read parameter value are sent to oscillator 10. The input voltage can remain fixed, yet the change in parameter value will reflect a drift in the output frequency. For that fixed input voltage, the drift amount and the corresponding parameter value are stored.

A monotonically increasing or decreasing parameter value and the corresponding output frequency drift form a linear, non-linear, or combination of linear and non-linear points along a graph. The points are stored as a table format, yet when plotted on a graph form a corresponding curve. That curve represents a transfer function. For each parameter change and corresponding output frequency drift, a transfer curve is formed even though the input voltage remains fixed. The transfer curve, and the necessary compensating voltage to retain a non-drift at the output frequency, form the overall transfer function execution engine, circuitry, or programmed methodology.

It may be desirable in certain applications for a user to select a voltage somewhere between the rails of a ground supply and power supply. That voltage might be a user-adjustable voltage $V_{ADJ}$. The user-adjusted voltage can be fed into a scalar circuit 30 which might scale down the change in the user-adjusted voltage by a factor of 100, 1000, or possibly more. Therefore, if the user wishes to increase the output frequency, an upward adjustment of $V_{ADJ}$ occurs on the input of the oscillator circuit, yet the scalar circuit 30 will reduce the upward change in the user adjustment and will place a lessened input voltage $V_{IN}$ (when compared to $V_{ADJ}$) on the input to oscillator 10 if the appropriate selector signal is chosen to selector circuit 22. Selector circuit 22 can thereby send possibly two or more parameters to oscillator 10. An example of such a selection might be the combination of $V_{IN}$ and PROCESS, or $V_{IN}$ and TEMP, or $V_{IN}$ and $V_{CC}$. Scalar circuit 30 thereby allows for fine tuning of the input voltage even though an adjustment is made at $V_{ADJ}$.

Turning now to FIG. 3, the various transfer curves of the input parameters are shown, and the relationship between each input parameter and the output frequency are illustrated. The illustrations, however, are simply examples of relativity and do not reflect necessarily an accurate relativity or fully encompassed transfer curve characteristic. Instead, FIG. 3 for sake of brevity illustrates exemplary types of transfer curves that might be encountered, but is not inclusive of all such curves in general.

In the simplest case, changes in temperature will cause changes in the output frequency, either as curve 32a or 32b. The curve shown as a non-linear curve, such as $ax^2+by$, which forms curve 32b. As noted by the phantom lines (dashed), at a temperature X, the output frequency might drift whereas at that temperature, the output frequency really should be at a nominal value (NOM). To achieve the nominal value, rather than the drifted (DRIFT) value, compensation is needed by changing the voltage value. The change in voltage value might be an increase in voltage if the compensated frequency is to achieve the nominal frequency amount above and beyond the drifted amount. Therefore, the input to the oscillator is one which has an increase in voltage needed to correct the drifted output frequency back to the nominal output frequency, shown as being greater than the drifted frequency. The transfer function is a combination of the transfer curve and the compensated voltage value.

The other curves 34, 36a, 36b, 38a, and 38b are fairly self explanatory based on the description of FIG. 2. In particular, while curve 34 is shown to rise upward slightly with increases in $V_{ADJ}$, the amount of increase in the output frequency is somewhat limited due to the scaling factor between the $V_{ADJ}$ and the input voltage. Thus, the curve 34 is a linear curve or a straight line having a fairly small slope in accordance with the transfer curve characteristic of ax. Curves 36a and 36b can also be linear. However, it is possible that the curves are non-linear, or a combination of both. An increase in the power supply change would most likely increase the output frequency along curve 36b. However, that increase need not be linear, and if it is linear, the linear initial point might be at a small frequency value, with the transfer curve represented as ax+b. Along with the other curves, curves 38a and 38b can have a transfer function that is linear or non-linear. In the example shown, a linear transfer curve of ax+b indicates an increase in frequency or a decrease in frequency if the process should change.

Each curve shown in FIG. 3 is indicative of only the change shown. In other words, the input voltage remains the same as well as all other parameters. Therefore, each curve shows the change effectuated by only the change of that particular input parameter, and no others. Again, each curve is not drawn to scale nor does each curve necessarily represent all such curves that might be derived from changes of an input parameter and the corresponding drift and output frequency.

Referring to FIG. 4, a voltage-controlled oscillator 40 is shown according to one aspect of the present invention. Oscillator 40 includes one or more sensors 42 and 44. Sensors 42 and 44 can receive readings of certain parameter values that can affect the output frequency of the oscillator. The sensor readings are shown fed into circuitry or subsystems (either hardware or software) 46 and 48 that contain a transfer function. A user-defined input voltage $V_{ADJ}$ can be forwarded to a scalar transfer function 50, and the combination of voltages from transfer function systems 46, 48, and 50 are added by a summing node 52. The summing node, which can comprise of a mixer, adds the voltages from each transfer function in accordance with a predefined ratio to form an input voltage at the output of the summing node 52. The input voltage has thereby been compensated by the transfer functions 46, 48, and 50 to produce a corrected output frequency even though the readings taken from the sensors indicate what might be a dramatically increased or decreased temperature or power supply drift.

The output from summing node 52 represents a voltage 54 that is centered about a fairly narrow bandwidth. A spread spectrum circuit 56 can be used if desired to receive the carrier frequency of the incoming voltage 54, and to modulate the carrier frequency with a modulated frequency possibly obtained either in open loop or from a divider 58. A code can be used to direct, for example, frequency hopping about the center of the carrier frequency based on the incoming modulated frequency to produce a spread spectrum signal 60. Signal 60 is shown having a greater bandwidth than signal 54, and the frequency bandwidth is desirably less than, for example, a low-pass filter 62. Although the spread spectrum circuit 56 is shown, it is recognized that circuit 56 is purely optional.

The input to the LCVCO 64 is compensated to maintain a nominal change in the output frequency even though substantial changes might occur on one or more input parameters. Accordingly, LCVCO 64 can be similar to the oscillator 10 (FIG. 1). Depending on the process skew parameters, a transfer function 66 might be used to take those skews into account, yet maintain the output frequency near the nominal frequency even though the process skews are substantial.

Figure 5:
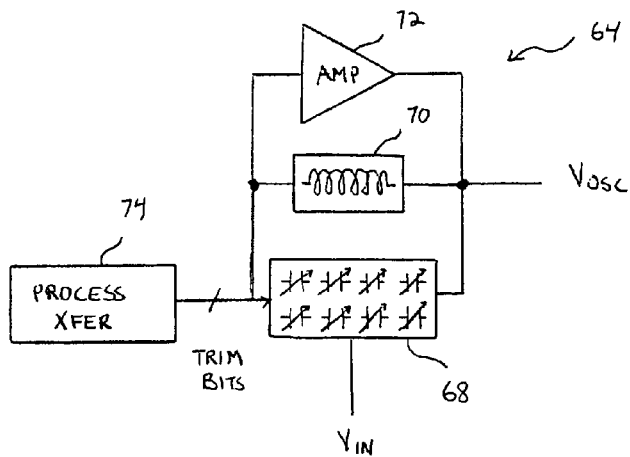
FIG. 5 is a block diagram of the voltage controlled oscillator of FIG. 1 having the total capacitance of a capacitor array which forms the varactor being controlled by a parameter input.

According to an alternative embodiment shown in FIG. 5, a variable capacitor 68 can be realized as an array of selectable capacitors, each of which might be individually a variable capacitor. Thus, the LCVCO 64 might contain a fixed inductor 70, an amplifier 72, but an array of variable capacitors 68 that are selected by trim bits output from the process transfer function 74. Depending on the amount of compensation needed, either more or less capacitance value can be selected by adding capacitors in parallel or series within array 68. Although the process transfer function 74 is shown, it is recognized that other transfer functions can also be used in the alternative to set the trim bits.

Figure 6:
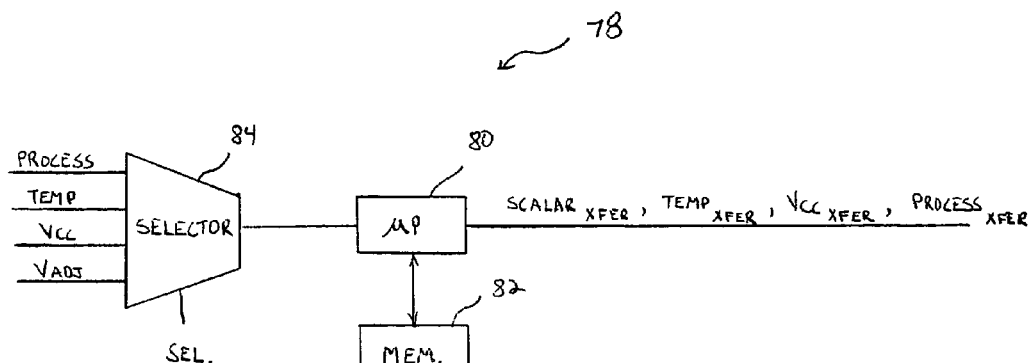
FIG. 6 is a block diagram of an execution engine (i.e., microprocessor) used to fetch an oscillator output frequency as a function of a parameter for producing a corresponding transfer function.

FIG. 6 illustrates an example of a system 78 used to form the various transfer functions. According to one embodiment, system 78 might comprise a microprocessor 80 and associated memory 82. One or more parameters can be selected by the selector circuit 84 and fed into microprocessor 80 registers. When called upon, the parameter value stored in the appropriate register will point to a parameter value within memory 82 and, particularly, the corresponding output frequency for that parameter value. If the output frequency extends above or below a threshold from a nominal frequency, then microprocessor 80 will induce an appropriate correction voltage as part of the transfer function. As shown in FIG. 4, the correction voltage will then be fed to the sum node 52 along with other voltages output from appropriate transfer function blocks. The sum result is then forwarded to the LCVCO 64 (FIG. 4).

Because of the temperature, voltage, and other compensation transfer function capabilities, the present oscillator circuit can compete in the marketplace with conventional crystal oscillators. It is anticipated that the cycle-to-cycle jitter can be around 20 picoseconds, accuracy can be within 25 ppm, packaging size is comparable and manufacturing cost is significantly less than crystal oscillators. In addition, the present oscillator can be formed on a single monolithic substrate and the trimming functionality can be performed through electronic trim bits, rather than a mechanical trim. Moreover, programming of the transfer functions can be performed either in the field through actual measurements or in the field through historical modeling data. Programming can occur in the package without having to remove the oscillator to perform any destructive or irreversible programming thereon.

The various circuit features set forth in the present disclosure are not to be interpreted as reflecting all possible features of the claimed invention. The specification and drawings are, therefore, to be regarded in an illustrative rather than a restrictive sense.

What is claimed is:

1. A voltage controlled oscillator, comprising:
   at least two sensors for determining two corresponding parameters which independently affect an output frequency of the oscillator;
   a transfer function coupled to receive each of the parameters to produce a corresponding voltage that compensates for any skewing of the output frequency caused by change of the parameters;
   a summing node coupled to the transfer function for adding each corresponding voltage and forwarding the sum result to a variable capacitor coupled to an inductor; and
   a scalar circuit configured to intercept a user-defined input voltage for adjusting the capacitance of the variable capacitor and for scaling the input voltage by a predetermined percentage before forwarding the scaled input voltage to the variable capacitor via the summing node.

2. The voltage controlled oscillator as recited in claim 1, wherein the at least two sensors comprise a temperature sensor and a power supply sensor.

3. The voltage controlled oscillator as recited in claim 1, wherein the parameters comprise external events that affect the output frequency and/or internal design characteristics that affect the output frequency.

4. The voltage controlled oscillator as recited in claim 3, wherein the external events comprise temperature fluctuations, power supply fluctuations, and ground supply fluctuations.

5. The voltage controlled oscillator as recited in claim 3, wherein the internal design characteristic comprise semiconductor layout fluctuations and semiconductor fabrication processing fluctuations.

6. The voltage controlled oscillator as recited in claim 1, wherein the transfer function comprises an execution engine adapted to:
   (i) fetch from a memory an oscillation frequency from a table of oscillation frequencies that vary as a function of the corresponding parameter, and
   (ii) produce the voltage corresponding to the fetched oscillation frequency.

7. The voltage controlled oscillator as recited in claim 1, wherein the transfer function comprises of linear circuits.

8. The voltage controlled oscillator as recited in claim 1, further comprising:
a scalar circuit configured to intercept a user-defined input voltage used to adjust the capacitance of the variable capacitor and to scale the input voltage by a pre-determined percentage before forwarding the scaled input voltage to the variable capacitor via the summing node.

9. The voltage controlled oscillator as recited in claim 1, further comprising:
a spread spectrum circuit coupled to receive a voltage output from the summing node that is oscillating at a carrier frequency and to modulate the carrier frequency to produce a spread spectrum output band in accordance with a code forwarded to the spread spectrum circuit.

10. An electronic system for producing an oscillating signal, comprising:
a first circuit having an input for converting a parameter that affects the frequency of the oscillating signal to a voltage that will not cause a change in the frequency of the oscillating signal even though the parameter has changed in value,
wherein the first circuit comprises an execution engine coupled to compare the parameter to a table of parameter values and corresponding set of frequencies to derive a compensated frequency near a nominal frequency value and to associate the nominal frequency value to the voltage;
a summing node for adding the voltage to a scaled, user-defined input voltage according to a predefined ratio; and
a second circuit adapted to produce the oscillating signal controlled by the summing node output.

11. The electronic system as recited in claim 10, wherein the parameter comprises either an external event that affects the frequency of the oscillating signal and/or an internal design characteristic that affect the frequency of the oscillating signal.

12. The electronic system as recited in claim 11, wherein the external event comprises temperature fluctuations, power supply fluctuations, and ground supply fluctuations.

13. The electronic system as recited in claim 11, wherein the internal design characteristic comprises semiconductor layout fluctuations and semiconductor fabrication processing fluctuations.

14. The electronic system as recited in claim 10, further comprising:
a scalar circuit configured to intercept a user-defined input voltage used to adjust a frequency of the oscillating signal and to scale the input voltage by a pre-determined percentage before forwarding the scaled, user-defined input voltage to the second circuit via the summing node.

15. The electronic system as recited in claim 10, further comprising:
a spread spectrum circuit coupled to receive a voltage output from the summing node that is oscillating at a carrier frequency and to modulate the carrier frequency to produce a spread spectrum output band in accordance with a code forwarded to the spread spectrum circuit.

16. A method for producing an oscillating signal, comprising:
converting a parameter that affects the frequency of the oscillating signal to a voltage that is corrected by a change of the parameter,
wherein converting comprises:
comparing the parameter to a table of parameter values with corresponding frequency values;
deriving a compensated frequency near a nominal frequency value; and
associating the nominal frequency value to the voltage;
adding the voltage to a scaled, user-defined input voltage according to a predefined ratio; and
producing the oscillating signal having a frequency that is controlled by the added voltages.

17. The method as recited in claim 16, wherein said converting comprises sensing an event that affects the frequency of the oscillating signal.

18. The method as recited in claim 16, further comprising:
scaling a user-defined input voltage used to adjust a frequency of the oscillating signal by a pre-determined percentage before controlling the frequency of the oscillating signal.

19. The method as recited in claim 16, further comprising:
receiving the added voltage that is oscillating at a carrier frequency; and
modulating the carrier frequency to produce a spread spectrum output band in accordance with a coded instruction.

* * * * *

UNITED STATES PATENT AND TRADEMARK OFFICE
CERTIFICATE OF CORRECTION

PATENT NO.      : 7,583,154 B1                                          Page 1 of 1
APPLICATION NO. : 11/241078
DATED           : September 1, 2009
INVENTOR(S)     : John Kizziar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 279 days.

Signed and Sealed this

Fourteenth Day of September, 2010

David J. Kappos
*Director of the United States Patent and Trademark Office*